(12) United States Patent
Bresser et al.

(10) Patent No.: US 10,579,845 B2
(45) Date of Patent: Mar. 3, 2020

(54) MEASUREMENT DEVICE AND METHOD FOR A MULTIDIMENSIONAL SIGNAL ANALYSIS

(71) Applicant: Rohde & Schwarz GmbH & Co. KG, Munich (DE)

(72) Inventors: Gerd Bresser, Munich (DE); Luke Cirillo, Poing (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 531 days.

(21) Appl. No.: 14/942,624

(22) Filed: Nov. 16, 2015

(65) Prior Publication Data
US 2017/0138992 A1    May 18, 2017

(51) Int. Cl.
*G06K 9/00* (2006.01)
*G01R 23/165* (2006.01)

(52) U.S. Cl.
CPC ............. *G06K 9/00* (2013.01); *G01R 23/165* (2013.01)

(58) Field of Classification Search
CPC ........ G06K 9/00; G01R 23/165; G01R 13/02; G01R 13/0254
See application file for complete search history.

(56) References Cited

U.S. PATENT DOCUMENTS

| | | | |
|---|---|---|---|
| 7,873,486 B2 * | 1/2011 | Earls | G01R 23/16 324/76.19 |
| 8,442,789 B2 * | 5/2013 | Eckert | G01R 23/18 702/76 |
| 2015/0338442 A1 * | 11/2015 | Alley | G01R 13/0254 702/67 |

* cited by examiner

*Primary Examiner* — Mohamed Charioui
*Assistant Examiner* — Catherine T. Rastovski
(74) *Attorney, Agent, or Firm* — Lee & Hayes, P.C.

(57) ABSTRACT

The invention is related to a method and a measurement device for performing multidimensional signal analysis. The measurement device comprises at least one input terminal configured to apply a signal for a signal analysis. A displaying unit is configured to display the applied signal. A masking unit is configured to define a signal mask, wherein at least one signal mask parameter of the signal mask dynamically varies over the signal analysis time of the applied signal.

17 Claims, 9 Drawing Sheets

MEASUREMENT DEVICE AND METHOD FOR A MULTIDIMENSIONAL SIGNAL ANALYSIS

FIELD OF THE INVENTION

The invention relates to a method and a measurement device for performing a multidimensional signal analysis. The invention preferably relates to a method for determining at least one signal mask parameter of a signal mask for a multidimensional signal analysis.

While multidimensional signal analysis is a subset of a signal analysis, it is unique in that it is able to deal with signal parameter of one dimension and also able to deal with signal parameter using more than one dimension.

A signal mask might be a one-dimensional or two-dimensional signal parameter definition in which range an observed signal parameter should not be contained (negative mask) or should always be contained (positive mask).

BACKGROUND OF THE INVENTION

A measurement device might be used for the determination, the displaying and the signal analysis of electrical signals in either frequency domain, such as a spectrum analyzer, e.g. a vector network analyzer, short VNA, and/or in time domain, such as an oscilloscope, e.g. a digital storage oscilloscope, short: DSO. An Oscilloscope might comprise means for a Fourier transformation to transform an applied signal from the time domain in the frequency domain in order to analyze this signal also in a frequency domain.

To determine an unusual or unexpected signal behavior, so called signal mask tests or signal limit-line tests are defined and applied to the signal to be analyzed in a measurement device.

The signal mask might for instance be defined to obtain a trigger event on which basis the signal to be analyzed or another signal processing unit might be triggered. Alternatively and or additionally, the signal to be analyzed is observed in view of a signal mask violation to identify signal parameters that exceed or undershot the predefined signal parameter definition. For instance, a signal limit might be predefined by the signal mask to identify and/or mark signal regions of the signal that violate this definition. In case all signal parameters of the signal to be analyzed are disposed within the defined signal mask parameter a validity of the signal might be approved.

According to U.S. Pat. No. 8,442,789 B2 a method and device for an automatic generation of a signal mask is described. Therein a signal mask is disposed above or below a signal's frequency spectrum of a detected signal. A determination of an ordinate value of a first envelope curve as a limit value is linked to a window function. As a result of the determination a smoothing of the characteristics of the envelope curve is implemented on the limit of the frequency spectrum disposed respectively within an environment.

However, the defined signal masks are static over the signal analysis. In case a signal analysis of a signal with signal parameters in more than one dimension should be performed, the known signal mask test cannot be applied. Especially, signal parameters of time-variant signals, e.g. signals with an output characteristic that is depend explicitly upon time, such as pulse signals cannot be analyzed using the known signal mask test. Thus, as a drawback of this static solution of a signal analysis, the usage of such a signal mask test is limited.

Thus, there is a need for providing a measurement device and/or a method for performing a multidimensional signal analysis, preferably on time-variant signals.

SUMMARY OF THE INVENTION

According to a first aspect of the invention a measurement device is configured to perform a multidimensional signal analysis. The measurement device comprises at least one input terminal configured to apply a signal for a signal analysis. The measurement device further comprises a display unit configured to display the applied signal. The measurement device further comprises a masking unit configured to define a signal mask, wherein at least one signal mask parameter of the signal mask dynamically varies over the signal analysis time of the applied signal.

Such a measurement device allows the definition of a signal mask whose signal mask parameter varies in at least one dimension, preferably varies with time. Thus, a signal mask is obtained that might be used for a signal analysis of at least one signal parameter of a time-variant signal.

The measurement device is preferably an oscilloscope, more preferably a DSO or a spectrum analyzer, preferably a VNA.

"Multidimensional" signal analysis means that at least a second dimension of the signal is observed. So the dependency of the signal of at least two signal parameters is observed. Thus, a plurality of signal parameters might be observed, wherein a time variance of the signal can be observed with an appropriately adaption of the signal mask parameter of the signal mask, performed by the masking unit. Thus, it is possible to identify a time-variable signal parameter using an adaptable signal mask.

The signal analysis is preferably obtained on an applied signal at the input terminal of the measurement device. At a first instant of time, the signal might be analyzed with a signal mask that is adapted to this first instant of time. Preferably at a subsequent second instant of time, the applied signal—that might comprise a different set of signal parameters is again analyzed having a respectively adapted signal mask. The adaption of the signal mask is obtained by defining a variable signal mask parameter, such as a dynamic parameter of the signal mask.

Such a dynamically changing signal mask parameter might be an upper threshold limit or a lower threshold limit of a signal parameter of the applied signal presented on a first diagram axis, which needs to be analyzed, such as an amplitude value of a voltage, a current or a power value of the signal to be analyzed. Additionally and or alternatively, a dynamically changing signal mask parameter might be a threshold limit of a signal parameter of the applied signal presented on a second diagram axis, which needs to be analyzed, such as a duration value, a time value or a frequency value of the signal to be analyzed.

Also, a start value and/or a stop value of a signal parameter of the analyzed signal might be defined as a dynamically changing signal mask parameter and varied over the signal analysis time.

The signal analysis might preferably be a power versus frequency versus time analysis or a power versus time versus trigger event, but also other domains such as a amplitude value, e.g. of a filtering unit or an amplifier unit and/or a correlation parameter and/or model parameters which could be incorporated depending on the preferred signal analysis application.

Thus, the proposed invention might comprise a measurement device capable of performing a signal analysis in multi dimensions, whereof particular interests in the multidimensional analysis are over three signal dimensions.

The defined multidimensional signal mask can be applied across the analysis' domains, such as frequency or time. This could be used for checking a spectral emission of a frequency dimension or a verifying of a power envelope remaining with specifications in a time domain.

The ability to vary a signal mask parameter dynamically during the signal analysis is thus proposed herein. This means that the signal mask could change its signal parameter definition in any of the dimensions during the process of signal analysis and of making the measurement. For instance, the position of a signal parameter to be observed could be shifted in width or duration or position across an axis with respect to time in each direction. Additionally and/or alternatively, the position of another signal parameter to be observed could be shifted in height across another axis with respect to time in each direction.

The signal masks parameters can be predefined manually by a user or automatically by the measurement device, wherein the masking unit obtains additional information on how to dynamically vary at least one signal mask parameter over the signal analysis time.

In a preferred embodiment the signal mask is a one-dimensional signal limit line. This limit line defines a threshold value of the signal to be applied. In case the signal crosses this signal limit line by overshooting or exceeding, a mask violation is occurred.

Additionally or alternatively a two-dimensional signal mask can be defined. A two-dimensional signal mask is an area within a signal diagram which might be a positive or a negative signal mask. This means that the defined area in the signal diagram is defined as the area in which the signal should be contained or is defined by the area in which the signal should not be contained.

The measurement device might comprise a processing unit that is configured to indicate a mask violation of the applied signal. Such an indication might be a visual presentation of the mask violation on the display screen, and/or an acoustic signal provided by the measurement device and/or the presentation of a trigger event which might be used as an external trigger signal and/or which might be used for stopping the signal analysis at the time instant on which the mask violation has been observed.

If at least one signal parameter of the signal to be analyzed is disposed outside of the defined signal mask parameter, the measurement device might indicate the mask violation. The term "mask violation" herein after is referred to a signal point or signal region of the applied signal in the signal analysis at which the signal to be applied exceeds or undershoots the defined time-variant signal mask.

In a more preferred embodiment the measurement device might further comprise a user's input unit configured to provide the at least one signal mask parameter. The processing unit is configured to calculate the signal mask based on the provided signal mask parameter. Especially, a user input can be provided, such as a temperature variable referring to a change of a value of the signal to be applied. To start the dynamic variation another external trigger signal might be needed in order to apply the user input for the referenced time instant.

Thus, a user provides input values which are used by the masking unit to determine the variation of the signal mask parameter of the signal mask. Alternatively, the user input provides a signal parameter trajectory as a signal parameter trajectory which is used to determine the variation of the signal mask parameter of the signal mask.

In a preferred embodiment the variation of the signal mask parameter is provided as a calculation scheme for calculating the variable signal mask parameter over the signal analysis time. Thus, a mathematical formula might be provided by the user that describes how the signal mask parameter varies over the time. This might be provided as a polynomial or piecewise polynomial value or a series of values, such as x and y points or specific time durations.

In a more preferred embodiment the processing unit is configured to calculate the signal mask parameter variation based on a stored and/or predefined signal parameter trajectory that comprises the at least one signal mask parameter. This signal parameter trajectory might be provided via user's input or might be included in a measurement device storage unit. Thus, it is possible to determine a signal mask parameter, such as an absolute value or a maximum/minimum value of a signal parameter that should not be exceeded or undershoot. Alternatively and/or additionally, relative values might be provided, which are derived from a signal mask parameter in order to shift the signal mask from a first value to another predefined value different to the first value.

In an alternative embodiment the measurement device might comprise a processing unit that is configured to interpolate a signal mask parameter of the signal mask based on a provided reference signal mask set for predefined signal analysis instants of time. Thus, a user's input and/or a signal parameter trajectory provide at least two signal masks with at least one different signal mask parameter for different reference instants of time of the signal analysis. Between two subsequent signal masks, provided as reference signal masks, an interpolation scheme might be applied by the measurement device. This interpolation scheme might be a linear interpolation or a sinc-function interpolation or an interpolation scheme according to another function provided to the processing unit.

In another preferred embodiment the measurement device further comprises a control signal input configured to apply a control signal and a processing unit configured to calculate the at least one signal mask parameter variation based on a determined value of the control signal. For simultaneous measurements of the control signal and a relationship between the external control signal and the signal mask it is now possible to determine the signal mask parameter and to subsequently apply a signal mask at the specific time in dependence on the control signal value as determined.

For instance, a control signal might be applied to a baseband input terminal of the measurement device and the user provides a mapping, such as scaling and an offset, so that the signal waveform can be translated to a signal parameter trajectory, which can then be used for alignment of the signal mask which might vary with time as the signal control value changes.

In a more preferred embodiment the control signal might be a baseband signal and the processing unit might be configured to determine an offset value of the control signal which is a basis for a shift of the signal mask over the signal analysis time. The shift is applied to at least one signal mask parameter of the signal mask.

In a more preferred embodiment the control signal is a mode signal of the applied signal, for instance provided by a device under test, DUT, and the processing unit is configured to calculate the at least one mask parameter for the signal mask based on the determined mode of the mode signal from the DUT. Thus, a look up table, LUT, might be provided in the measurement device or in a signal parameter trajectory configured to be connected to the measurement device in which the at least one signal mask parameter varies with the mode of the DUT. This variation of the signal parameter is determined by the LUT. Thus, the signal analysis can be applied to the DUT that functions on different modes, wherein a signal mask is varied with the applied mode of the DUT.

In another preferred embodiment the measurement device further comprises a processing unit configured to calculate the at least one signal mask parameter variation from at least one measured signal parameter of the applied signal. Thus, for signal analysis of the signal, a measurement is applied that is used for further calculations. Preferably, a signal mask can be defined with a relative signal mask parameter and this relative signal mask parameter is then positioned at a given time instant of the signal analysis time that is determined by the measurement device according to a rule which might be specified by the user.

In a preferred embodiment the signal parameter is a peak frequency of the applied signal and the signal mask parameter is a center frequency of the signal mask. This center frequency might be measured and thus used to align the signal mask. Alternatively, this frequency value is measured and obtained by an integration of a signal region of the applied signal and thus the center frequency is an average frequency of the applied signal.

Upon each calculation scheme of the signal mask parameter variation as described above, the masking unit and/or the processing unit are configured to apply an appropriately varied signal mask to the applied signal for signal analysis purposes. Thus, the variation of the signal mask parameter is applied dynamically during the signal analysis.

According to another aspect of the invention a method for determining at least one signal mask parameter of a signal mask for multidimensional signal analysis is provided. The method comprises the following steps: displaying an applied and/or buffered signal on a display of a measuring device and defining a signal mask, wherein at least one signal mask parameter of the signal mask dynamically varies over the signal analysis time of the applied and/or buffered signal.

This method might include the applying of an input signal to be analyzed and a buffering of the signal in a buffer unit of the measurement device.

Preferably, the defining step of the method includes a determining of a signal parameter of the applied and/or buffered signal and the calculation of a signal mask parameter variation based on the determined signal parameter.

Alternatively, the defining step is obtained by calculating the at least one signal mask parameter variation based on a user's input.

Alternatively and/or additionally, the defining step is obtained by providing a control signal to the measurement device and calculating the at least one signal mask parameter variation based on a determined value of the control signal.

Additionally and/or alternatively, the defining step might be obtained by providing predefined reference signal masks for reference time points in the signal analysis time and interpolating the at least one mask parameter variation based on the mask parameter of two subsequent reference masks.

Upon each calculation of the signal mask parameter variation as described above, the masking unit and/or the processing unit apply an appropriately varied signal mask to the applied signal for signal analysis purposes. Thus, the variation of the signal mask parameter is applied dynamically during the signal analysis.

BRIEF DESCRIPTION OF THE DRAWINGS

In the following exemplary embodiments of the invention are described with reference to the drawings. Those exemplary embodiments do not limit the scope of the invention. The same reference signs in different drawings indicate the same elements or at least the same functions unless otherwise stated.

DETAILED DESCRIPTION OF THE PREFERRED EMBODIMENTS

Figure 1:
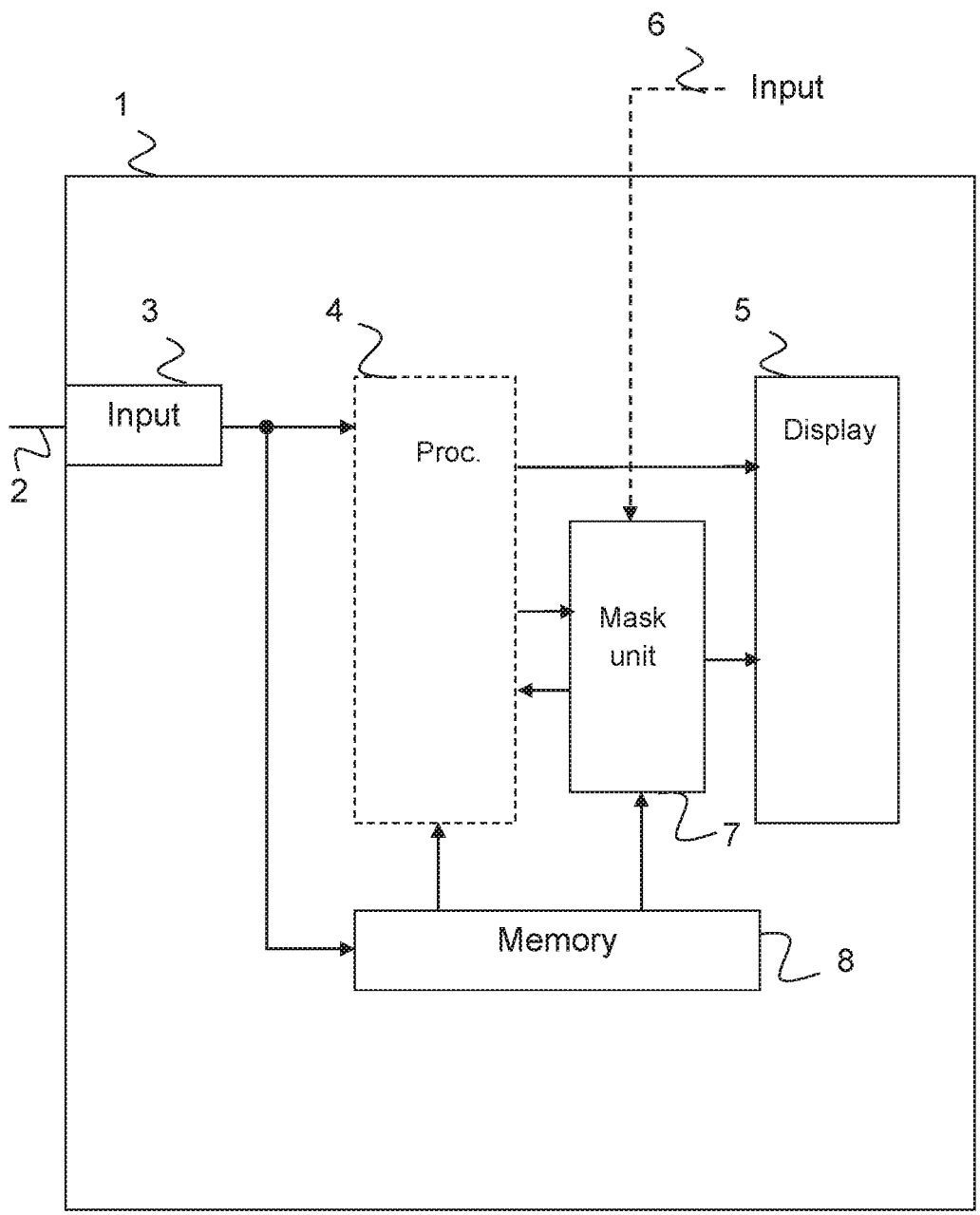
FIG. 1 shows a first exemplary embodiment of a measurement device according to the invention.

FIG. 1 shows a first exemplary embodiment of a measurement device 1 according to the invention. The measurement device 1 comprises an input terminal 2 on which a signal to be analyzed is applied. The signal to be applied is provided to an input section 3 of the measurement device 1. The input section 3 is used to prepare the signal to be applied for a subsequent signal analysis. The output of the input section 3 is provided to a display unit 5 in order to display the applied signal at the display unit. Optionally, a processing unit 4 is used to prepare the input signal for the display unit 5. A buffer unit 8 is provided to buffer the input signal. A mask unit 7 is inserted in the inventive measurement device 1 in order to define a signal mask M which is also displayed on the display unit 5.

The signal mask M is used to define variations of the signal to be applied from a signal that is predefined in order to obtain information about signal parameters that exceed or undershoot this predefined limit. This signal mask M might be a threshold line, also referred to as limit line, which defines a threshold level of the signal to be applied and on which an exceeding or an undershooting causes a mask violation MV that is determined. Additionally and/or alternatively, the signal mask M is an area of a two-dimensional signal diagram in which the signal to be applied should be inserted and included or should be excluded. The mask M could comprise any two-dimensional geometric form, wherein each corner is to be defined as a signal mask parameter.

The mask unit 7 defines a signal mask M that comprises signal mask parameter varying over the signal analysis time. This is useful to obtain information on the signal which might also vary with the time. Especially, pulsed signals comprise at least one variable signal parameter over the signal analysis time which cannot be measured with a static signal mask M that does not apply a variable signal mask parameter.

The variation of the mask parameter can be an absolute value or a minimum value or a start or a stop value of the signal mask M. Such a variable signal mask enables an at least three-dimensional signal analysis. Each corner of the geometric form that builds the mask M can thus be defined variable.

For instance, the measurement device 1 is an oscilloscope or a spectrum analysis, in which a signal to be applied is observed in time domain or in frequency domain. Thus, a signal to be applied might be buffered in the buffer unit 8 and a history function of the measurement device 1 might be used to display the signal at the display unit 5. To provide the analysis on a signal that varies with the time it is necessary to apply a signal mask M that also varies with the time. Thus, a three-dimensional signal analysis is possible wherein the signal masks M of the measurement devices 1 are extended with a time axis. Thus, signal distortion or spurious effect on signals to be applied with time variant preferences can be detected in an easier manner.

For instance, a detected frequency signal spectrum of an applied signal might be displaced in both frequency directions in each case by a given frequency value. If the two frequency spectra displaced respectively by the determined variable frequency value in positive and negative frequency direction are connected to one another horizontally at the respective dividing points and displaced vertically upwards and/or downwards by multiplication in each case by an appropriate amplification factor, an upper and/or lower frequency signal mask M which is distanced from the detected frequency spectrum in the horizontal and also in the vertical direction could be applied. The variation of the frequency signal mask M is obtained by the masking unit 7. The frequency value by which the detected frequency spectrum is displaced in the horizontal direction, and the amplification factor, by which the horizontally displaced frequency spectrum is displaced vertically can be predetermined by the user.

The respectively obtained variable signal parameter mask M is preferably linked to a window function of which the window type and/or width (time, frequency) and/or height (amplitude) are different. A given window type, for example, parabolic, Gaussian or rectangular, is allocated to the window function to which the signal is linked.

The signal mask M might be calculated based on the determined signal mask parameters. For instance, a determination scheme as described in U.S. Pat. No. 8,442,789 B2 might be applied.

Figure 2:
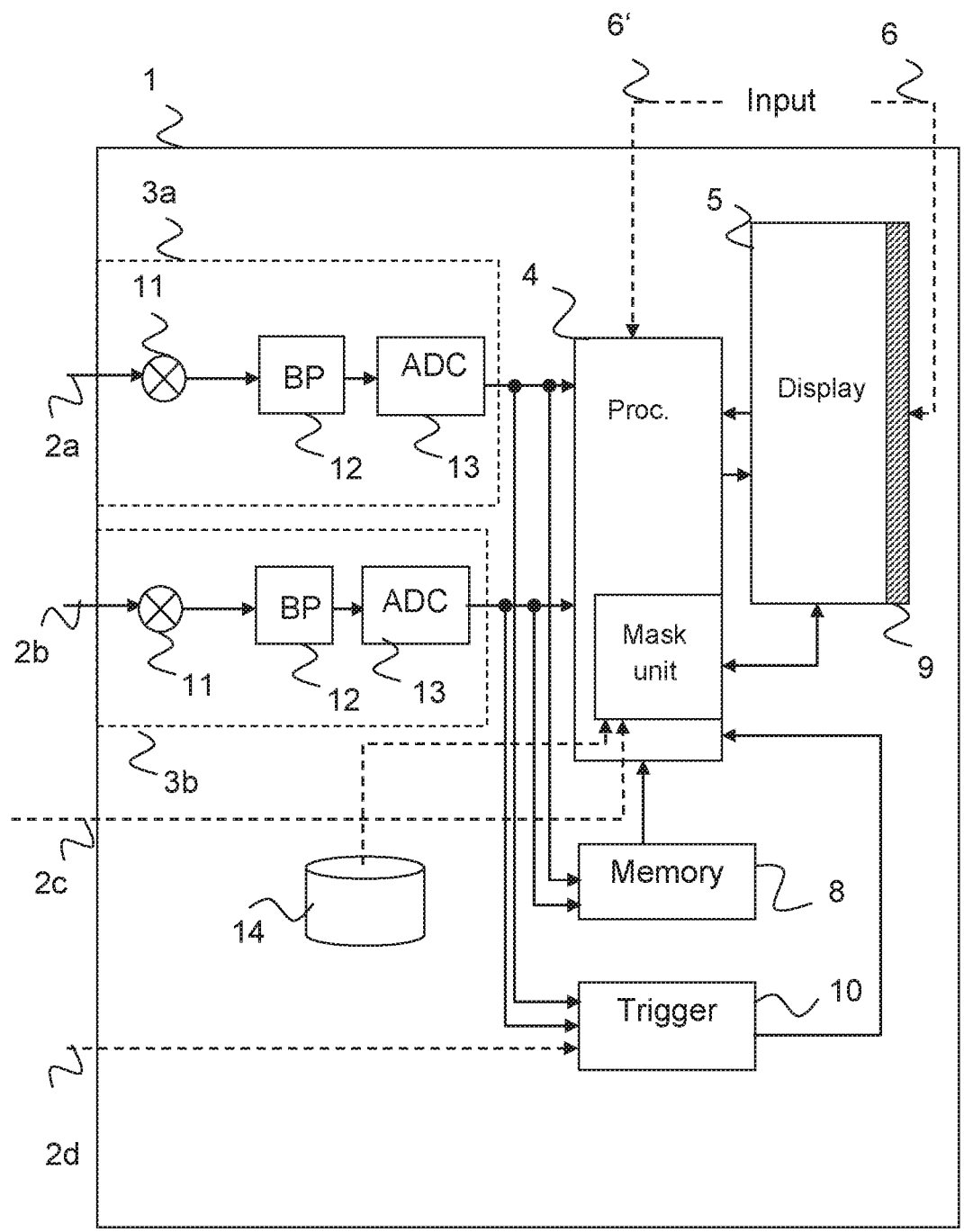
FIG. 2 shows a second exemplary embodiment of a measurement device according to the invention.

In FIG. 2 a second exemplary embodiment of a measurement device 1 according to the invention is shown. Herein the units of the measurement device 1 are described in greater details. For instance, the input section 3 is shown in greater details, wherein each input section 3a, 3b of the measurement device 1 according to FIG. 2 comprises a modulation unit 11 that demodulates an applied signal from a radio frequency range to an intermediate range. Additionally, a bandpass filtering unit 12 and an analog-digital-converting unit 13 are inserted to provide a digitized frequency-band limited signal to the processing unit 4. According to FIG. 2 the measurement device 1 comprises at least a first input terminal 2a, and a second input terminal 2b on which signals to be applied can be connected. Thus, model parameters or correlations on different signals can be determined using the measurement device 1. The applications for such a signal analysis are described in greater details below.

Furthermore, it is shown in FIG. 2 that the mask unit 7 is a part of the processing unit 4 and realized for instance as an ASIC or an FPGA. A buffer unit 8 and the display unit 5 are shown, wherein the display unit 5 comprises a touch screen 9 on which an input 6 might be provided. Thus, a user might be able to identify signal parameters on a signal to be applied on which basis a signal mask M should be defined. Thus, a predefined signal mask M can be input. Additionally and/or alternatively, the input 6 provides varying mask parameters via the user's input to adjust the signal mask parameters from the signal mask M. In case, the display unit 5 does not comprise a touch screen 9 an additional input terminal might be provided via the input unit 6' so that a user's input can be provided directly to the processing unit 4. Such an input 6' might be a keypad or a mouse or a serial data interface or so on.

In FIG. 2, a trigger unit 10 is shown that is used to provide at least one trigger event to the processing unit 4 based on the inputted signal 2a and/or the signal 2b.

Alternatively and/or additionally, an external trigger signal 2d might be applied to the measurement device 1 for providing the processing unit 4 with a triggering event.

In FIG. 2 a control signal input 2c is shown that provides a control signal to the mask unit 7 or the processing unit 4 in order to define the signal mask parameters based on a control signal 2c applied externally from the measurement device 1.

Figure 3:
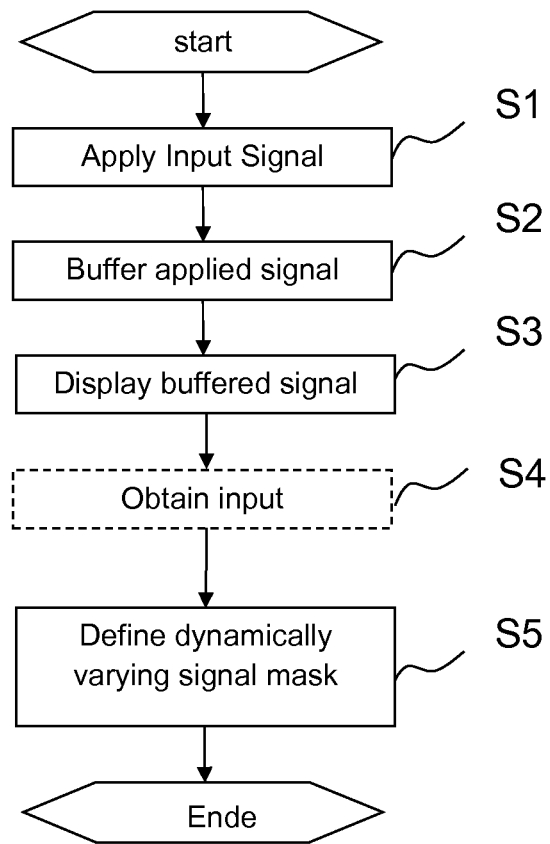
FIG. 3 shows an exemplary embodiment of a flow diagram of a method according to the invention.

In FIG. 3 an exemplary embodiment of a flow diagram of a method according to the invention is shown. In step S1 an input signal is applied to a measurement device 1. In step S2 the applied signal is buffered using a buffer unit 8 of the measurement device 1. In subsequent step S3 the buffered and/or applied signal is displayed on a display unit 5 of the measurement device 1.

In optional step S4 inputs are obtained from a control signal 2c or a user's input 6 in order to obtain information on how the signal mask M might be varied over a signal analysis time. In step S5 the signal mask M is dynamically varied over the signal analysis time using the input or the signal to be applied.

In the embodiments according to FIG. 1 to FIG. 3 it is shown that a mask unit 7 might be provided with varying signal mask parameters. The signal mask parameters might be obtained from a control signal 2c or a signal parameter trajectory 14 that is included in the measurement device 1 or might be provided by user's input 6. Additionally and/or alternatively, the mask parameters might be obtained from the signal to be applied 2a, 2b.

Figure 4:
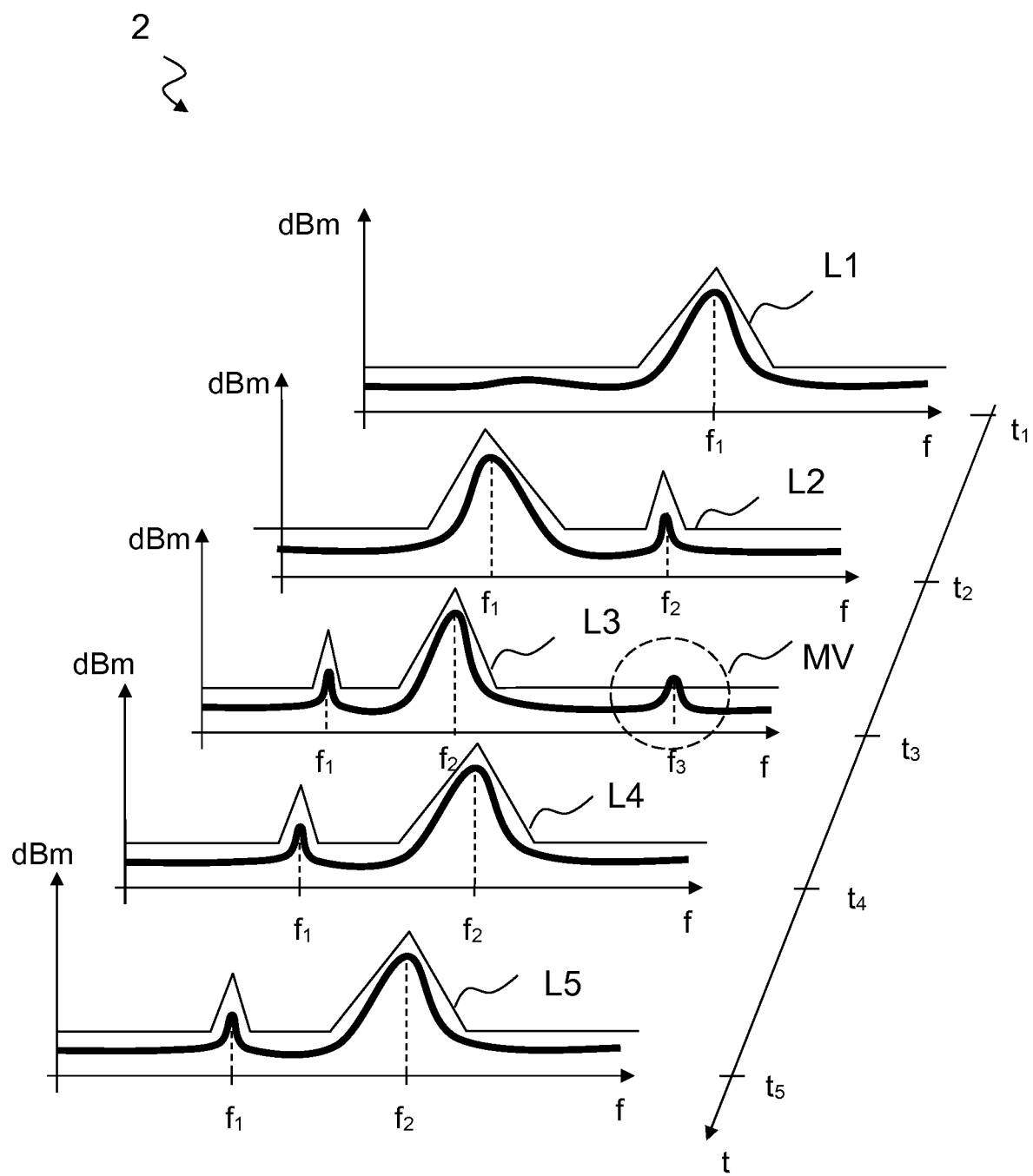
FIG. 4 shows a first exemplary embodiment of an inventive signal mask parameter variation.

In FIG. 4 a first exemplary embodiment of a varying signal mask is shown. Therein, five different signal diagrams are shown. Those diagrams are signal diagrams of a signal analysis on five different time instants $t_1$ to $t_5$. Thus, FIG. 4 shows a three-dimensional signal analysis, wherein the signal is a variation of the power versus frequency over the five time instants.

According to a first time instant $t_1$ the signal 2 comprises a spectral power distribution that comprises a peak frequency at a frequency $f_1$. A signal mask L1, herein after as referred to signal limit L1, is predefined with an upper threshold value at which the power in dBm of the signal should not exceed. The peak of the signal mask L1 corresponds to the frequency peak $f_1$ of the signal 2 to be applied.

Now referring to time instant $t_2$ it can be seen that the applied signal 2 changes its spectral power distribution over the frequency in that the center frequency $f_1$ is shifted and also in that a second peak frequency $f_2$ is now contained in the signal spectrum. Thus, the signal mask L2 has to be adapted in case this behavior of the signal is normal and within a predefined range. In direct contrast to the signal mask L1 at time instant $t_1$, the signal mask L2 at time instant $t_2$ comprises a second peak frequency at the peak frequency $f_2$ of the spectrum of the signal 2 in time instant $t_2$.

At time instant $t_3$ another signal spectrum of the signal 2 is shown. Herein, the spectrum frequency again changes in that the first peak frequency $f_1$ comprises a power that is lower than the second frequency peak $f_2$. This is considered as a normal behavior since the resulting signal mask L3 is adjusted accordingly. A mask violation MV is detected and indicated at frequency $f_3$. Herein, the signal spectrum comprises a third frequency peak $f_3$ at a position on which no frequency peak should be applied. This is indicated as an unusual behavior and the mask violation MV is indicated on the display unit 5 of the measurement device 1. Alternatively and/or additionally, an acoustic signal could be generated by the measurement device 1. Alternatively and/or additionally, the signal analysis could be stopped at time point $t_3$ in order to indicate the mask violation MV.

At the time instants $t_4$ and $t_5$ additional signal spectra are shown of the signal 2 applied to the input terminal of the measurement device 1. As can be seen, the signal masks L4 and L5 are respectively adapted due to frequency shifts according to $f_1$ or $f_2$ and no mask violation MV is contained in these time instants $t_4$ and $t_5$.

As can be derived from FIG. 4, the signal mask L1 to L5 changes over the time $t_1$ to $t_5$. This variation is obtained by a user's input unit 6, 6' or an external control signal 2c or a signal parameter trajectory 14 or by calculating signal parameters from the signal to be applied, as will be explained in greater details below.

Figure 5:
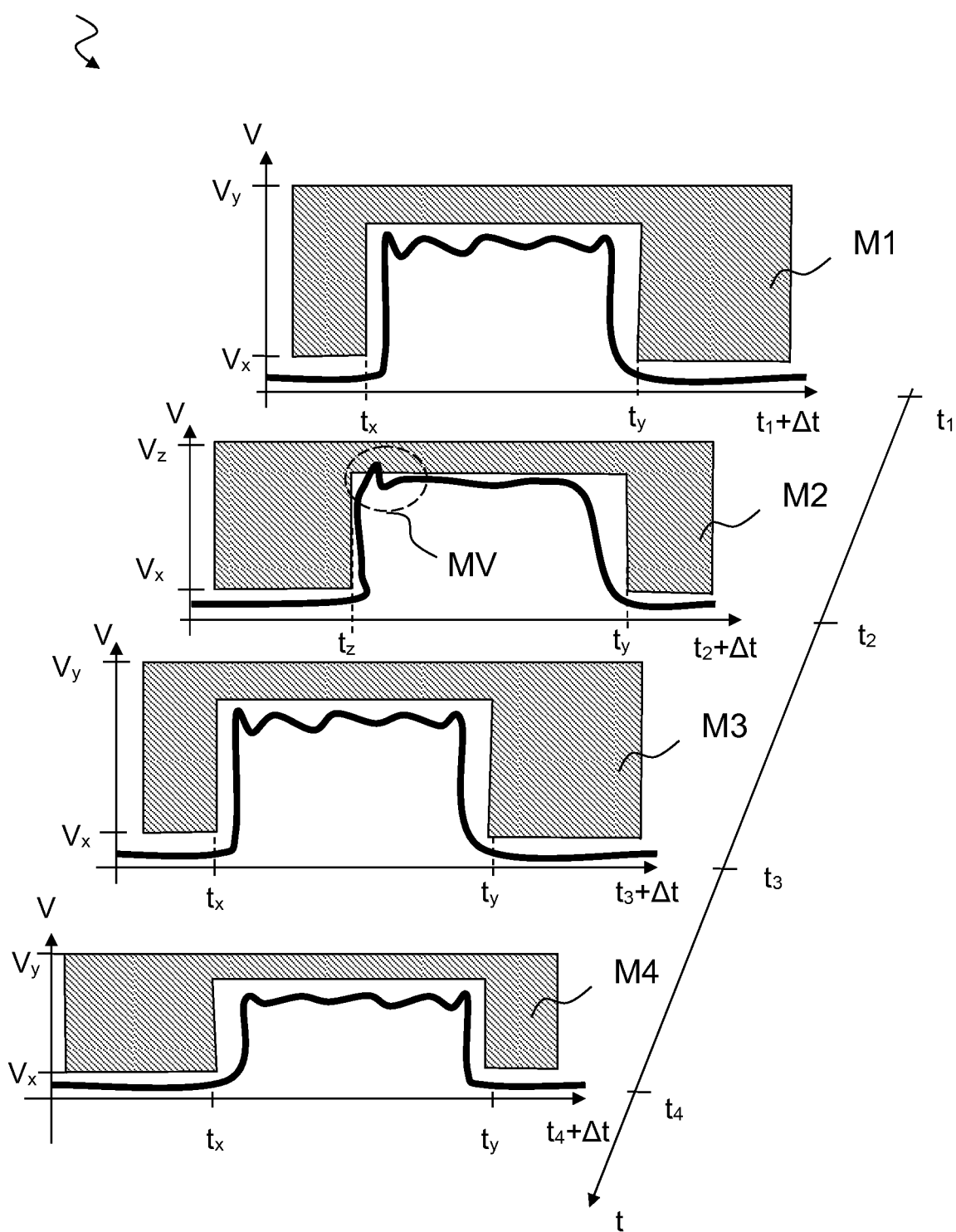
FIG. 5 shows a second exemplary embodiment of an inventive signal mask parameter variation.

In FIG. 5 another exemplary embodiment of a signal mask that varies over time is shown. According to FIG. 5 a time domain signal 2 is shown wherein the amplitude of a voltage applied to the input terminal 2 on a measurement device 1 is displayed. According to time instant $t_1$ a pulse of a signal 2 is displayed on a display unit 5. A signal mask M1 is defined by a start time $t_x$ and a stop time $t_y$ as well as a lower threshold $v_x$ and an upper threshold $v_y$. This mask M1 might be predefined by a user's input over the user's input unit 6, 6' or might be measured from the applied signal.

At time instant $t_2$ a mask violation is indicated, since the applied signal 2 exceeds the mask M2. As can be obtained by the definition of the mask M2, the mask M2 according to time instant $t_2$ differs in another starting time $t_2$ and another voltage value $v_2$ compared to the mask M1. The masks M3 and M4 are respectively amended according to the time instants $t_3$ and $t_4$.

The masks M1 to M4 are time variant signal masks and differ with the waveform of the signal 2. The signal amplitude has a time variant behavior and can be analyzed with this time variant signal mask over a different time instants $t_1$ to $t_4$.

To obtain the mask parameters that vary over time of the signal analysis, different methods or embodiments are provided with this invention.

A user's input 6, 6' can for instance be used to provide a mathematical formula as a calculation scheme by the user itself that describes, how the signal mask parameter or the limit line L changes with the different time instants $t_1$ to $t_5$. Especially, a polynomial or a piecewise polynomial can be provided. Alternatively and/or additionally, a series of signal parameter values, for instance the time values $t_x$ and $t_y$ or voltage values $v_x$ and $v_y$ or the peak frequency $f_1$, $f_2$ according to FIG. 4 and FIG. 5 can be provided by a user's input 6, 6'.

Alternatively and/or additionally, a specific duration, for instance the time interval $t_y$ to $t_x$ or a voltage range $v_y$ to $v_x$ can be provided as a series of values for signal parameters. Such a value may be given as absolute value or a relative value. The value might be provided directly to the processing unit 4 for calculation the signal mask parameter variation and to further calculate the signal mask M that needs to be applied for a specific time instant $t_x$. Additionally or alternatively, the value might be provided in form of a signal parameter trajectory 14 that is either inserted in the measurement device 1 or that is alternatively connected to the measurement device 1 via a control signal input 2c, 2e.

In case an absolute time is provided as a calculation scheme from the user's input 6, the measurement device 1 comprises a processing unit 4 that comprises an absolute time base. The processing unit 4 is thus configured to calculate the signal mask M according to this absolute time base. The absolute time base might be provided by an external signal 2e to the measurement device.

Alternatively and/or additionally, a relative time value might be provided that implies that the measurement device 1 comprises an additional external trigger signal 2d that can be used as a reference signal for time alignment of the signal mask M. Thus, the trigger signal 2d is used in the processing unit to calculate the signal mask based on the relative value that is provided as an input value.

Alternatively and/or additionally, an absolute frequency might be provided by user's input and this implies that the frequency mask M is specified absolutely, for instance in Hertz.

In case a relative frequency value is provided by the user's input a frequency mask M is specified relatively to a center frequency $f_c$ of the measurement device 1. The processing unit thus shifts the mask M in dependence on the mask parameter.

Additionally and/or alternatively, the signal mask parameter is provided from a signal parameter trajectory 14 that is included in the measurement device 1 or that might be connected to the measurement device 1.

In case the user's input 6 is provided via a touch screen, it might be possible that the processing unit offers a pre-defined set of signal mask parameters that are predefined upon signal analysis and are thus meaningful mask parameter values.

Additionally and/or alternatively, an interpolation is used based on a provided reference signal mask set. Thus, a user predefines at least two reference signal masks as a mask set for a specific reference time instant $t_x$. The time instants $t_x$ are provided using the scheme as provided and described above. The interpolation can be a linear interpolation between two subsequent predefined signal masks. Alternatively, a sinc-function interpolation might be provided via the user's input 6. Thus, different signal masks M can be calculated based on the predefined reference mask set and can be applied for a multidimensional signal analysis.

Additionally and/or alternatively, simultaneous measurements of an applied external control signal 2c and a relationship between the value of the control signal 2c and a mask M can be used or provided by the user.

For instance, a voltage controlled oscillator, VCO, control signal can be applied to a baseband input on the measurement device 1. The user provides a mapping, such as a scaling and an offset, so that the VCO signal 2c can be translated to a frequency trajectory, which then can be used for alignment of the frequency mask as a signal mask example, which varies with time as the VCO control signal $2c$ changes the voltage.

Alternatively, a baseband I/Q signal could be applied, wherein a peak frequency of the baseband signal is determined and used to calculate an offset of the frequency being measured at which a frequency should be positioned. During the measurement, the position of the signal mask M changes as the position of the frequency in the baseband I/Q signal changes.

Alternatively, the control signal $2c$ is a mode signal that is used to retrieve a particular signal mask from a look up table, LUT, or a predefined value. During the measurement, the currently active signal mask changes according to the mode of the device under test, DUT.

Additionally and/or alternatively, the signal mask parameter is derived through analysis of the signal to be applied. Thus, a signal mask M might be defined from a relative signal value, such as a relative frequency or a relative time. Thus, the center value is unknown but not necessary for the signal analysis. A center frequency at which a frequency mask is positioned can be determined by the measurement device 1 according to a rule which might be specified by a user. At a specific time point a peak frequency might be used from the measurement of the signal to align the signal mask M. Alternatively and/or additionally, a center frequency is obtained by averaging a signal region and to provide an average frequency signal to align the signal mask M.

Figure 6A:
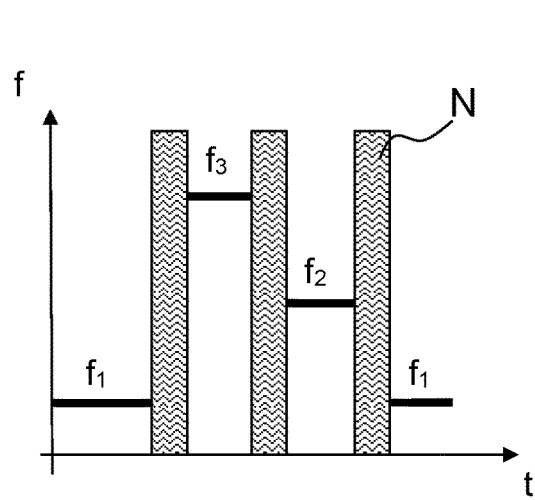
FIG. 6a shows a first exemplary control signal to be applied to the inventive measurement device for adapting a signal mask.

Specific applications can now be used to provide a multidimensional signal analysis. For instance a spectrum analysis can be used for instance for frequency hopping signals. As can be seen in FIG. 6a the frequency that is used is changed at different time slots. Between this time slots a noise signal is derived only. To adjust the signal mask M according to the frequency $f_1$, $f_2$ or $f_3$ that is used at a specific time point the measurement device 1 should comprise an input control signal $2c$ on which the frequency hopping signal can be applied. Thus, the frequency hopping can be analyzed and it could be determined whether the desired frequencies in the appropriate time frames or time slots are adjusted. It can be further configured if spurious signals and/or noise is applied that disturbs the control signal $2c$.

Figure 6B:
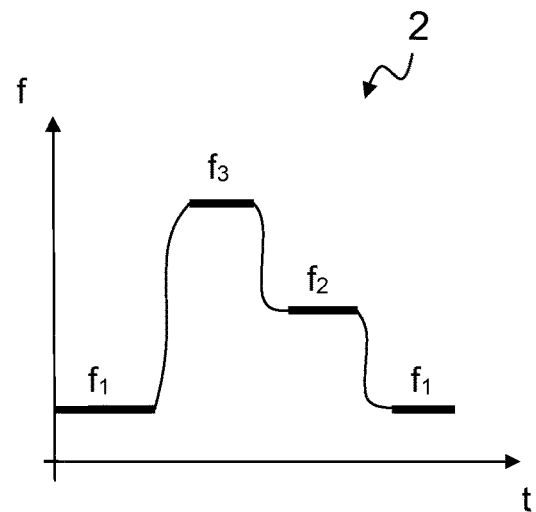
FIG. 6b shows a second exemplary control signal to be applied to the inventive measurement device for adapting a signal mask.

To increase the interoperation and to reduce interferences it might be necessary to provide the signal with static frequency changes from the specific time slots, as can be seen in FIG. 6b.

In another application a spectrum analysis can be obtained for mobile communication systems and their modulation schemes provided therein. Thus, it can be obtained if the modulated signal comprises undesired harmonics on the carrier frequency or whether the signal interferences neighboring channels.

Another application might be a time analysis of a circuit. Therein, it could be determined whether signal variations occur during desired behaviors and whether undesired pulses are generated that might lead to disturbances in the circuit.

In another embodiment a time analysis of different diagrams can be used. This is especially important for serial protocols at different clock rates for instance the CAN FD-Bus. Therein the time variance of the clock change can be analyzed.

In another embodiment a temperature dependent time analysis of a circuit can be provided. Thus, the variation of time can be used and it could be identified whether the circuit provides the desired function also with varying temperatures.

In another application of the invention the control of a motor can be time analyzed. Thus, different scenarios under different output voltages can be evaluated.

In another embodiment a traditional frequency-mask trigger, FMT might solve the problem of finding random or sporadically occurring frequency events via the user-definable mask in a power versus frequency scheme. This mask M is defined in terms of a pair of frequency and power points which remain fixed for the duration of a measurement.

Often a signal mask M is defined which excludes a signal of interest, such as a continuous wave carrier, and a lower limit on power outside of the occupied spectrum. Such a mask can be effective in catching so called spurious emissions which arise outside the spectral band permitted for a given application.

The difficulty with this approach arises when spurious effects which occur within the frequency band of the transmitted signal need to be captured. For instance, a frequency-hopped signal, which can arise in both communications and radar applications, as a frequency chirp signal which is typically in radar applications. In both of these cases the instantaneous bandwidth of the transmitted signal is small with respect to the total transmission bandwidth to transmitted center frequency were raised in time.

Figure 7:
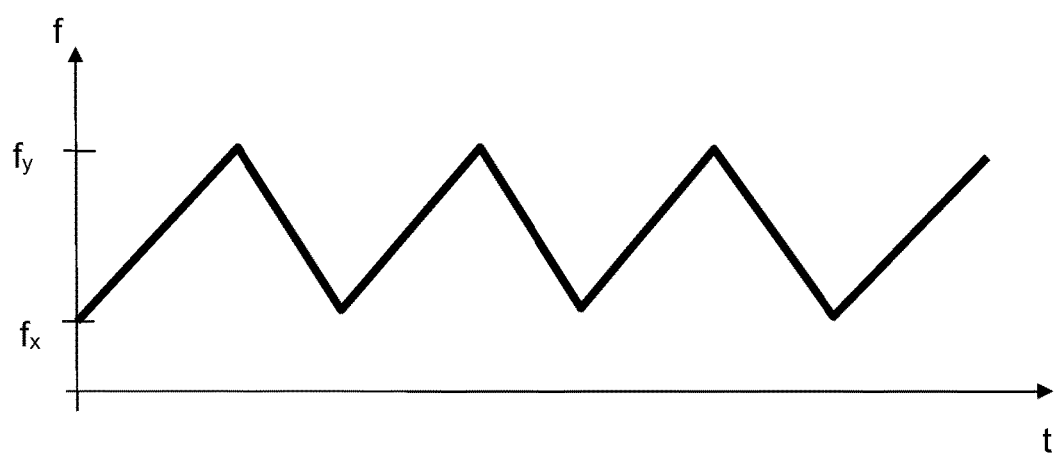
FIG. 7 shows a third exemplary control signal to be applied to the inventive measurement device for adapting a signal mask.

A frequency chirp signal is shown in FIG. 7. In order to catch spurious emissions with the frequency band of the transmitted signal, a time varying frequency mask trigger as described within this invention is required. Such a mask is defined relatively to the currently transmitted center frequency at any given time.

Figure 8:
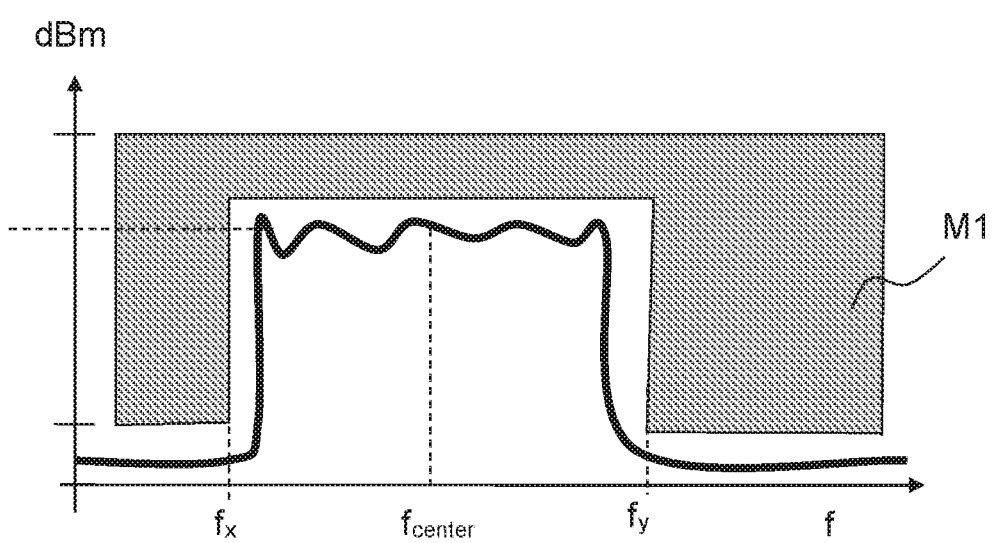
FIG. 8 shows an exemplary embodiment for calculating a signal parameter based on the applied signal.

In FIG. 8 a specific frequency mask M1 is shown for a power versus frequency signal diagram at a specific time instant $t_x$. Therein, a measured signal comprises a frequency range from $f_x$ to $f_y$. In case this pulse of frequencies is changed over time it is advantageous to derive a center frequency $f_{center}$ which can be obtained by a processing unit 4 via an integration of the power versus frequency signal 2. The derived center frequency is then the average frequency which could be used as the value for adjusting the signal mask M1 for specific time instants $t_x$ in case the pulse changes with different times.

Figure 9:
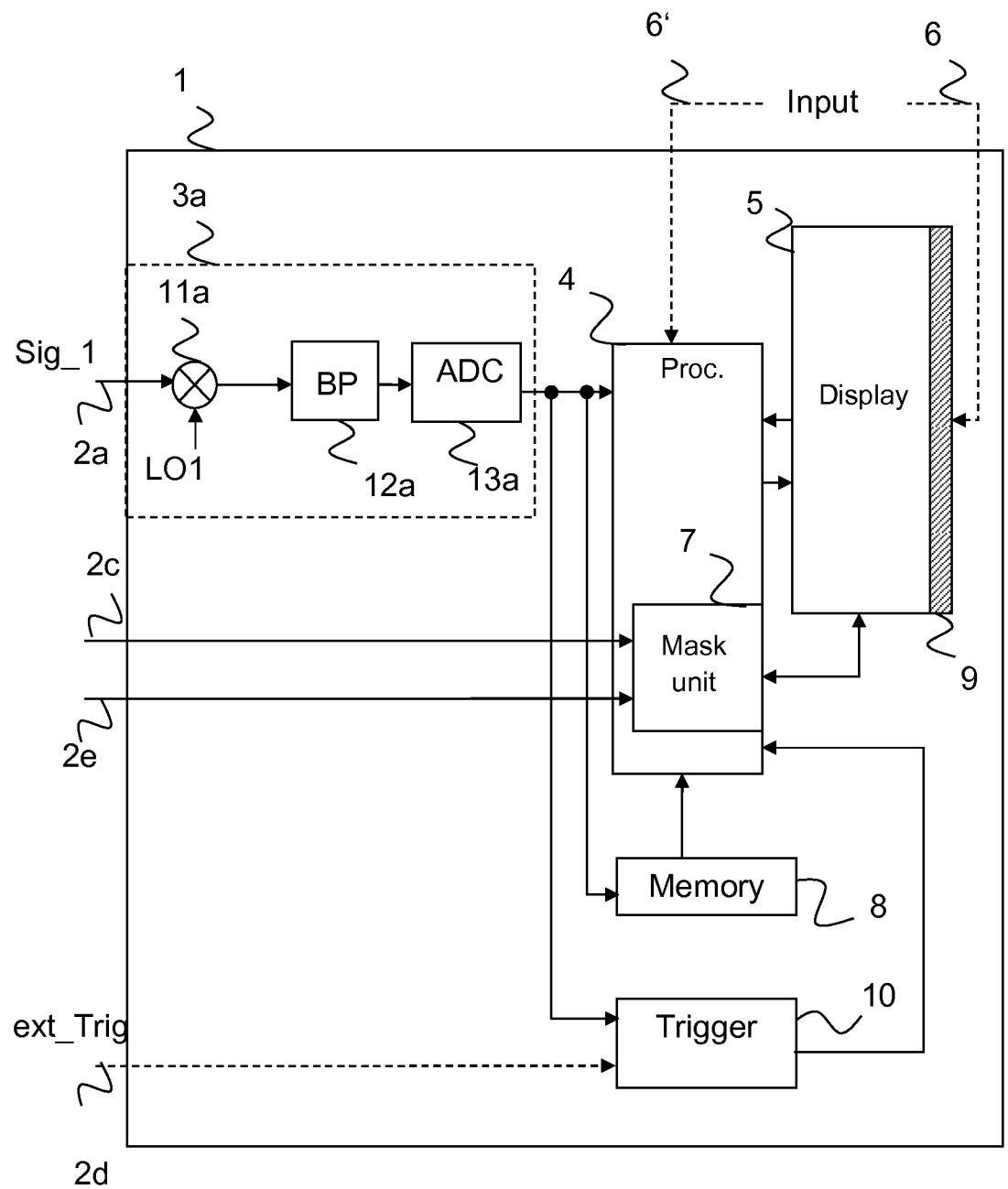
FIG. 9 shows a third exemplary embodiment of a measurement device according to the invention.

FIG. 9 shows a third exemplary embodiment of a measurement device 1 according to the invention. Therein, the mask unit 7 obtains a first control signal $2c$ and a second control signal $2e$. These control signals $2c$ and $2e$ are derived from a DUT. The input terminal $2a$ obtains DUT RF-signals as signals to be analyzed. Those RF-signals are mixed to an intermediate frequency, filtered by the bandpass filter 12 and digitized with the analogue-digital-converter 13. The digitized signal is then processed with an FPGA 4 module, which implements a Fourier transformation process of the signal parameter to calculate a spectrum that is displayed on the display unit 5. The FPGA 4 also implements logic of comparing the computed spectrum to a signal frequency mask M. The signal frequency mask M in this case is calculated from a relative frequency mask that is defined by the user and input via the input unit 6, 6'. This relative frequency mask M is shifted at the position that is determined by a frequency trajectory 14 provided by the user via the mathematical function or an external signal $2c$, $2e$ as well as the timing signal which may be an absolute or relative value in form of an external TTL-trigger signal.

Figure 10:
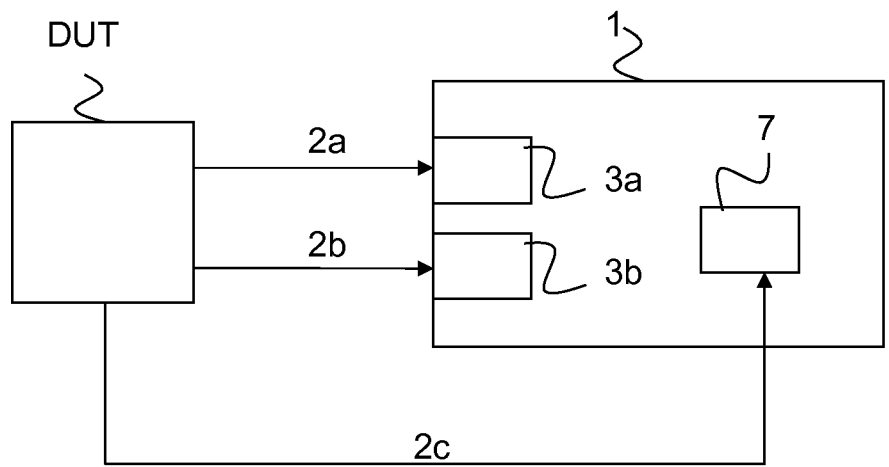
FIG. 10 shows an exemplary embodiment for an inventive signal analysis using the measurement device according to the invention.

Now referring to FIG. 10, a system for measuring the behavior of a DUT is shown. The DUT provides at least two radio frequency signals $2a$ and $2b$ to respective input sections $3a$ and $3b$ of a DUT. A control signal $2c$ is further derived from the DUT and directly provided to a mask unit 7 in order to change a signal mask parameter in dependence on the value derived from the control signal 2c. Thus, a time-varied signal mask is obtained that can be used for the application as described above.

All features of all embodiments described in the description, shown in the drawings and/or claimed in the claims herein can be combined with each other.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and the scope of the present invention should not be limited by any of the above-described embodiments. Rather, the scope of the invention should be defined in accordance with the following claims and their equivalence.

Although, the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one several implementation, such feature may be combined with one or more other features of the other implementations as may be desired and advantageous for any given or particular application.

What is claimed is:

1. A measurement device configured to perform a multidimensional signal analysis comprising:
   at least one input terminal configured to apply a signal for signal analysis;
   a display configured to display the applied signal;
   a mask configured to define a signal mask, wherein at least one signal mask parameter of the signal mask dynamically varies over a signal analysis time of the applied signal;
   wherein a trigger signal is used by the measurement device to start the dynamic variation of the signal mask in order to apply a user input to change a value of the applied signal for a referenced time instant; and
   wherein a control signal is applied to the measurement device for alignment of the signal mask with the control signal so that the signal mask varies with time as a value of the control signal changes.

2. The measurement device according to claim 1,
   wherein the signal mask is a one-dimensional signal limit line and/or a two dimensional signal mask and
   wherein the measurement device comprises a processor configured to indicate a mask violation of the applied signal.

3. The measurement device according to claim 1 further comprising:
   a user's input configured to provide the variation of the at least one signal mask parameter and
   the processor configured to calculate the signal mask based on the provided signal mask parameter variation.

4. The measurement device according to claim 3,
   wherein the signal mask parameter variation is provided as a calculation scheme for calculating the variable signal mask over time.

5. The measurement device according to claim 1 further comprising:
   a processor configured to calculate the signal mask parameter variation based on a stored and/or predefined signal parameter trajectory that comprises at least one signal mask parameter.

6. The measurement device according to claim 1 further comprising:
   a processor configured to interpolate a signal mask parameter of the signal mask based on a provided reference signal mask set for predefined signal analysis time instants.

7. The measurement device according to claim 1 further comprising:
   a control signal input terminal configured to apply the control signal;
   a processor configured to calculate the at least one signal mask parameter variation based on a determined value of a control signal.

8. The measurement device according to claim 7,
   wherein the control signal is a baseband signal; and
   wherein the processor is configured to determine an offset value of the control signal which is a basis for a shift of the signal mask over the signal analysis time.

9. The measurement device according to claim 7,
   wherein the control signal is a mode signal of a device under test and
   wherein the processor is configured to calculate the at least one signal mask parameter variation for the signal mask based on the determined mode of the device under test.

10. The measurement device according to claim 1 further comprising:
    a processor configured to calculate the at least one signal mask parameter variation from at least one measured signal parameter of the applied signal.

11. The measurement device according to claim 10,
    wherein the signal parameter is a peak frequency of the applied signal and the mask parameter is a center frequency of the signal mask and
    wherein the center frequency is an average frequency of the applied signal.

12. A method for determining at least one signal mask parameter of a signal mask for a multidimensional signal analysis, the method comprises the following steps:
    displaying an applied and/or buffered signal on a display of a measuring device;
    defining a signal mask, wherein at least one signal mask parameter of the signal mask dynamically varies over a signal analysis time of the applied and/or buffered signal;
    starting the dynamic variation of the signal mask with a trigger signal in order to apply a user's input to change a value of the applied and/or buffered signal for a referenced time instant; and
    applying a control signal to the measurement device to align the signal mask with the control signal so that the signal mask varies with time as a value of the control signal changes.

13. The method according to claim 12,
    wherein the defining is obtained by:
    determining a signal parameter of the applied and/or buffered signal; and
    calculating a signal mask parameter variation based on the determined signal parameter.

14. The method according to claim 12,
    wherein the defining is obtained by:
    calculating the at least one signal mask parameter variation based on a user's input.

15. The method according to claim 14,
    wherein the calculating is based on a provided calculation scheme.

16. The method according to claim 12,
wherein the defining is obtained by:
providing the control signal to the measurement device and
calculating the at least one signal mask parameter variation based on the determined value of the control signal.

17. The method according to claim 12,
wherein the defining is obtained by:
providing predefined reference signal masks for reference time instants in the signal analysis time; and
interpolating the at least one signal mask parameter based on the signal mask parameter variation of two subsequent reference masks.

* * * * *